(12) United States Patent
Greco et al.

(10) Patent No.: US 6,388,884 B1
(45) Date of Patent: May 14, 2002

(54) APPARATUS AND METHOD OF ACTIVATING A SWITCH WITH A CIRCUIT BOARD EJECTOR

(75) Inventors: Gerry A. Greco, Elk Grove Village; Salvatore R. Giammanco, Carol Stream; Charles A. Eley, Addison; Scot W. Salzman, Buffalo Grove, all of IL (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 09/583,433

(22) Filed: May 31, 2000

(51) Int. Cl.$^7$ .............................. H05K 7/14; H01H 9/20
(52) U.S. Cl. ...................... 361/754; 361/759; 361/798; 200/50.02; 200/51 R
(58) Field of Search ................... 361/753, 754, 361/759, 798, 801; 200/50.01, 50.02, 51 R; 439/157

(56) References Cited

U.S. PATENT DOCUMENTS 3,932,716 A * 1/1976 Mottel et al. ............ 200/50.02
4,596,907 A * 6/1986 LaGreco et al. ......... 200/50.01
4,798,923 A * 1/1989 Barwick et al. ......... 200/50.01
5,191,970 A * 3/1993 Brockway et al. .......... 200/335
5,343,009 A * 8/1994 Araoka et al. .............. 200/322
5,989,043 A * 11/1999 Han et al. .................... 439/157

* cited by examiner

Primary Examiner—Jayprakash N. Gandhi
(74) Attorney, Agent, or Firm—Baniak Pine & Gannon (57) ABSTRACT

An apparatus and method for activating a switch with a circuit board ejector includes a circuit board and a switch assembly including the switch for transitioning the circuit board from a first mode to a second mode and vice versa. The switch assembly is attached to the circuit board, and the circuit board ejector is rotatably attached to the circuit board to allow the circuit board ejector to be positioned in an unlatched position and a latched position. The circuit board ejector includes a hook portion and a bracket arm wherein the bracket arm of the circuit board ejector activates the switch assembly and causes the circuit board to transition from the first mode to the second mode and vice versa.

24 Claims, 5 Drawing Sheets

APPARATUS AND METHOD OF ACTIVATING A SWITCH WITH A CIRCUIT BOARD EJECTOR

FIELD OF THE INVENTION

This invention relates generally to the field of electronic chassis for high-speed telecommunications and networking applications and, in particular, to an apparatus and method of actuating a switch with a circuit board ejector.

BACKGROUND OF THE INVENTION

An electronic chassis which houses electronic components for high-speed telecommunication and networking applications typically includes a plurality of vertically oriented circuit board assemblies that are inserted into the chassis. Each circuit board assembly is typically comprised of a circuit board attached to a U-shaped channel member that serves as a front faceplate of the assembly. When the assembly is fully inserted, the circuit board is connected to a backplane printed circuit located along the backside of the chassis. One problem associated with this conventional arrangement is that the insertion force required to connect the circuit board to the backplane may make it difficult, if not impossible, for a technician to make the connection by manually forcing the channel member in a direction towards the backplane.

There are other problems that arise in connection with electronic chassis having a plurality of circuit board assemblies. For example, once the circuit boards are inserted into the chassis, they communicate with one another via the backplane printed circuit board. Problems arise, however, when "hot-swapping" one or more circuit board assemblies. Hot-swapping refers to exchanging circuit board assemblies without shutting off power to the chassis. In particular, problems may arise when a given circuit board assembly is removed from the chassis while it is communicating (i.e. transmitting and receiving signals) with other circuit board assemblies via the backplane circuit board. This may have an adverse effect on the flow of information between the various circuit board assemblies within the chassis thereby rendering the entire chassis unreliable. It therefore would be advantageous to have a mechanism that would transition the circuit board of a circuit board assembly from an operation mode to a reset mode prior to the circuit board being physically removed from the chassis. This would prevent the interruption of information flowing between the various circuit board assemblies within the chassis. Similarly, when a new circuit board is added to the chassis, the need exists for a mechanism that would ensure that the circuit board is attached to the backplane prior to the circuit board being transitioned to the operation mode.

In order to facilitate the physical connection of the circuit board to the backplane, attempts have been made to provide a lever that is that rotatably attached adjacent to a front edge of the circuit board, the lever having a handle portion and a hook portion. The lever is mounted to the circuit board so that it can rotate freely about a pin that is inserted through an opening in the circuit board. These conventional levers have been useful in terms of facilitating both the insertion of circuit boards into electronic chassis and the ejection of circuit boards from the chassis. However, such conventional levers do not have the capability of activating a switch on the circuit board to transition the circuit board from an operation mode to a reset mode and vice versa.

Accordingly, it would be desirable to have an apparatus and method of actuating a switch with a circuit board ejector that overcomes the disadvantages described above.

SUMMARY OF THE INVENTION

One aspect of the invention provides an apparatus for activating a switch with a circuit board ejector including a circuit board and a switch assembly attached to the circuit board. The switch assembly includes the switch for transitioning the circuit board from a first mode to a second mode and vice versa. The circuit board ejector is rotatably attached to the circuit board to allow the circuit board ejector to be positioned in an unlatched position and a latched position. The circuit board ejector includes a hook portion and a bracket arm. The circuit board ejector activates the switch assembly and causes the circuit board to transition from the first mode to the second mode and vice versa. The bracket arm of the circuit board ejector may preferably activate the switch assembly and may cause the circuit board to transition from the first mode to the second mode and vice versa. A bracket member may also be provided, and the circuit board may preferably be operatively attached to the bracket member. The bracket member may preferably be a U-shaped channel member. The switch assembly may further include a housing member mounted to the circuit board adjacent to the switch. A switch activation member may preferably be operatively attached to the housing member to allow the switch activation member to be positioned in an open position and a closed position. The switch activation member may preferably be biased in the open position, and may preferably be comprised of spring steel. The switch activation member may preferably include a planar body portion and a tab portion extending outward perpendicular from the planar body portion. The housing member may preferably include a slot formed therein, the tab portion extending through the slot of the housing member. The housing member may preferably include a plurality of circuit board locks, and the plurality of circuit board locks may preferably extend through openings in the circuit board. The housing member may preferably be comprised of a rigid, insulative material. The switch may preferably be an optoelectronic switch. The circuit board may preferably include a corner portion, and the circuit board ejector may preferably be rotatably attached to the corner portion of the circuit board.

The circuit board ejector may preferably include a body portion, a first end and a second end, and the hook portion may preferably be located at the first end. A manually operable cap may also be provided at the second end of the circuit board ejector. The manually operable cap may preferably be attached to the bracket arm. The circuit board ejector may preferably include a slot formed therein, and the bracket arm may preferably be disposed within the slot of the circuit board ejector. The circuit board ejector may preferably include a deflectable arm portion, and the deflectable arm portion may preferably extend outward from the body portion. The bracket arm may preferably be attached to the deflectable arm portion. The bracket arm may further include a contact portion for contacting the switch assembly. The contact portion may preferably include a beveled edge.

Another aspect of the invention provides method of activating a switch with a circuit board ejector. A circuit board and a switch assembly attached to the circuit board are provided. The switch assembly includes the switch for transitioning the circuit board from a first mode to a second mode and vice versa. The circuit board ejector is rotatably attached to the circuit board to allow the circuit board to be positioned in an unlatched position and a latched position. The circuit board ejector includes a hook portion and a bracket arm. The circuit board ejector is rotated from the unlatched position to the latched position, and the circuit board ejector is contacted against the switch assembly. The switch is activated, and the circuit board is transitioned from the second mode to the first mode. The bracket arm may preferably be contacted against the switch assembly. The circuit board ejector may preferably include a body portion and a deflectable arm portion extending outward from the body portion. The bracket arm may preferably be attached to the deflectable arm portion. A bracket member including a striking surface may also be provided. The circuit board may preferably be attached to the bracket member. The bracket arm may preferably be contacted against the striking surface, and the deflectable arm portion may preferably be biased.

Another aspect of the invention provides a method of activating a switch with a circuit board ejector. A circuit board and a switch assembly attached to the circuit board are provided. The switch assembly includes the switch for transitioning the circuit board from a first mode to a second mode and vice versa. The circuit board ejector is rotatably attached to the circuit board to allow the circuit board ejector to be positioned in an unlatched position and a latched position. The circuit board ejector is positioned in the latched position. The circuit board ejector includes a hook portion and a bracket arm, the bracket arm in contact with the switch assembly. The bracket arm is moved in a direction away from the switch assembly, and the switch is activated. The circuit board is transitioned from the first mode to the second mode. A manually operable cap may also be provided, and the manually operable cap may preferably be attached to the bracket arm, and the manually operable cap may preferably be depressed.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
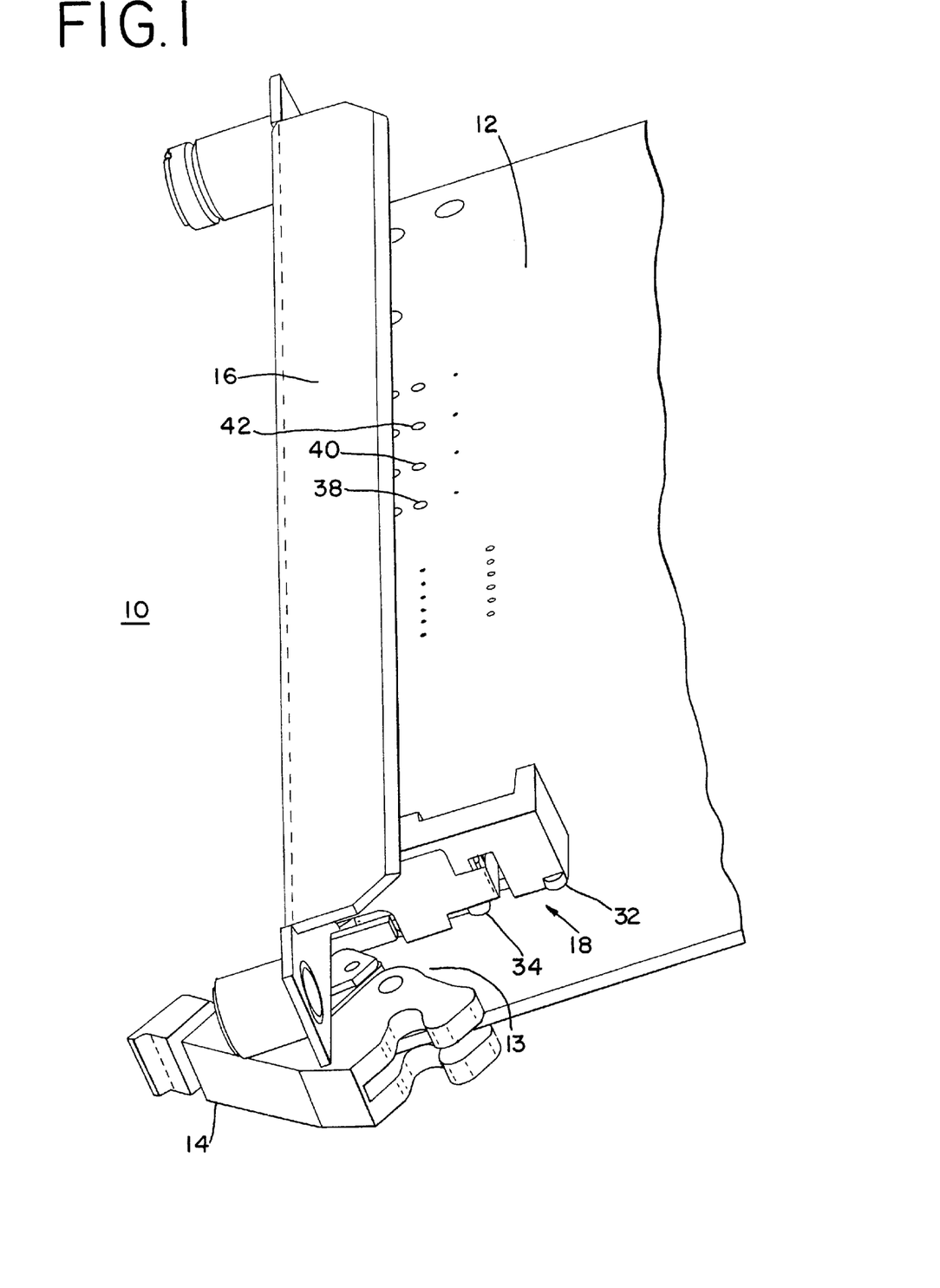
FIG. 1 is a perspective view of a preferred embodiment of an apparatus for activating a switch with a circuit board ejector that is made in accordance with the invention.
Figure 2:
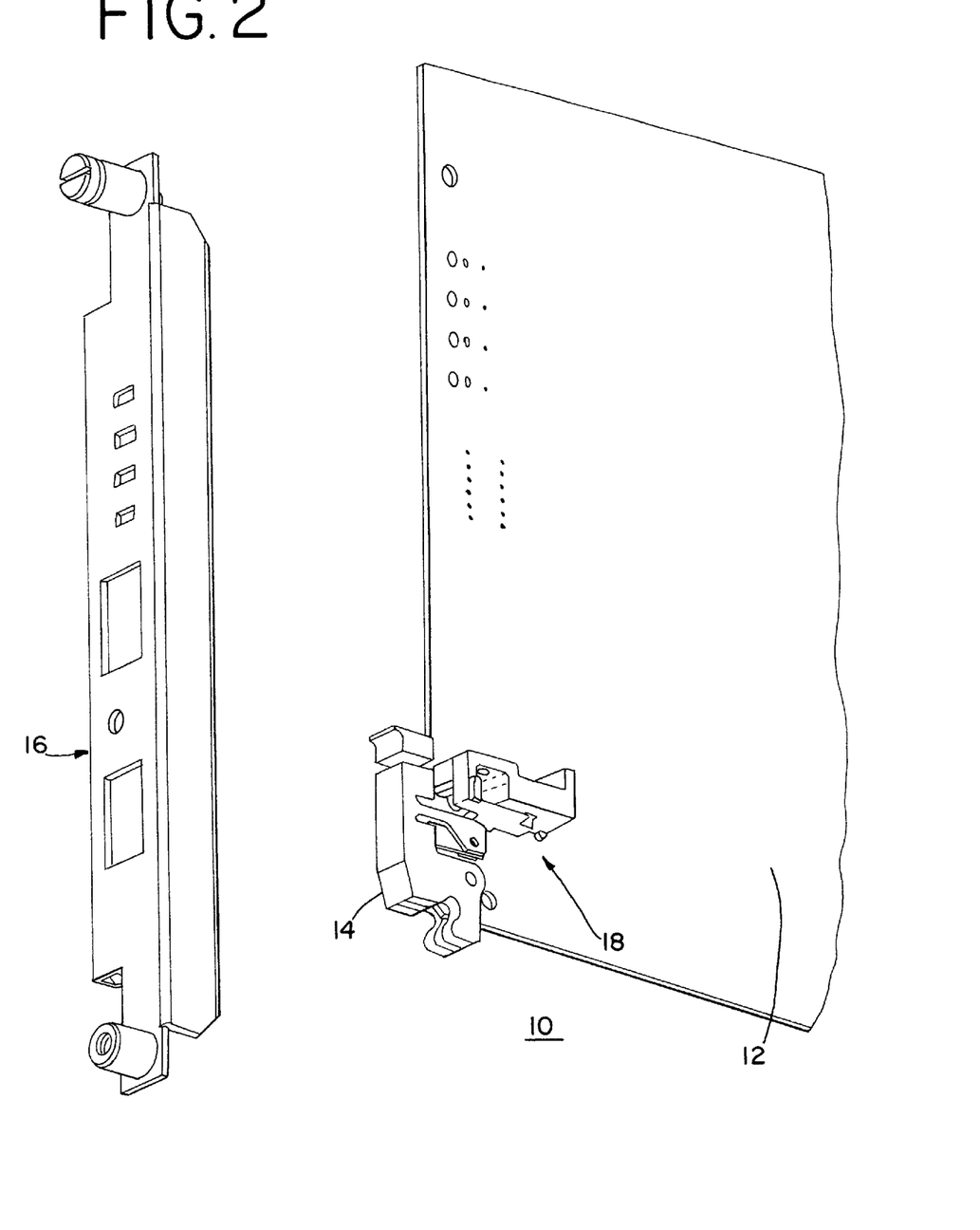
FIG. 2 is a perspective view of the of the apparatus for activating a switch with a circuit board ejector shown in FIG. 1 with the bracket member exploded from the circuit board.

As shown in FIGS. 1–2, a preferred embodiment of an apparatus 10 for activating a switch with a circuit board ejector includes a circuit board 12 and a circuit board ejector 14. The circuit board 12 may preferably be operatively attached to a bracket member 16. The bracket member 16 may preferably be any conventional bracket member adapted to mount to an electronic chassis (not shown). As shown in FIGS. 1 and 2, the bracket member 16 may preferably be a U-shaped channel member, although various shapes and configurations are contemplated. The bracket member 16 may be comprised of plastic or steel, or any other suitable rigid metallic or non-metallic mate The circuit board 12 may preferably be attached to the bracket member 16 with conventional fasteners such as, for example, rivets, screws, or bolts. The circuit board 12 may be any conventional printed circuit board.

As shown in FIGS. 1, 2, and 7–10 a switch assembly 18 is attached to the circuit board 12. As shown in FIGS. 7–10, the switch assembly includes a switch 20. The switch 20 transitions the circuit board 12 from a first mode to a second mode and vice versa. The first mode may preferably be, for example, a "power on" mode, and the second mode may preferably be a "power off" mode. Similarly, the first mode may preferably be a "set mode," and the second mode may preferably be a "reset mode." In short, the switch 20 may preferably be used to transition the circuit board 12 to and from a number of types of modes, including, for example, a power save mode, standby mode, etc. The switch 20 may preferably be any conventional optoelectronic switch. The optoelectronic switch may preferably be any electronic device capable of, for example, emitting, transmitting, and sensing light. However, it should be understood by those of ordinary skill in the art that many other types of switches may be used without departing from the spirit of the invention. The circuit board ejector 14 is rotatably attached to the circuit board 12 to allow the circuit board ejector 14 to be positioned in an unlatched position (see FIG. 7) and a latched position (see FIG. 9). The circuit board ejector 14 can be rotated from the unlatched position to the latched position to mechanically secure the circuit board 12 and the bracket member 16 to an electronic chassis (not shown). In addition, the circuit board ejector 14 can be rotated from the latched position to the unlatched position to eject the circuit board 12 and the bracket member 16 from the electronic chassis (not shown). Moreover, and as will be described in further detail below, the circuit board ejector 14 activates the switch assembly 18 on the circuit board 12, which in turn causes the circuit board 12 to transition from the first mode to the second mode and vice versa.

Figures 3, 4, 5, 6:
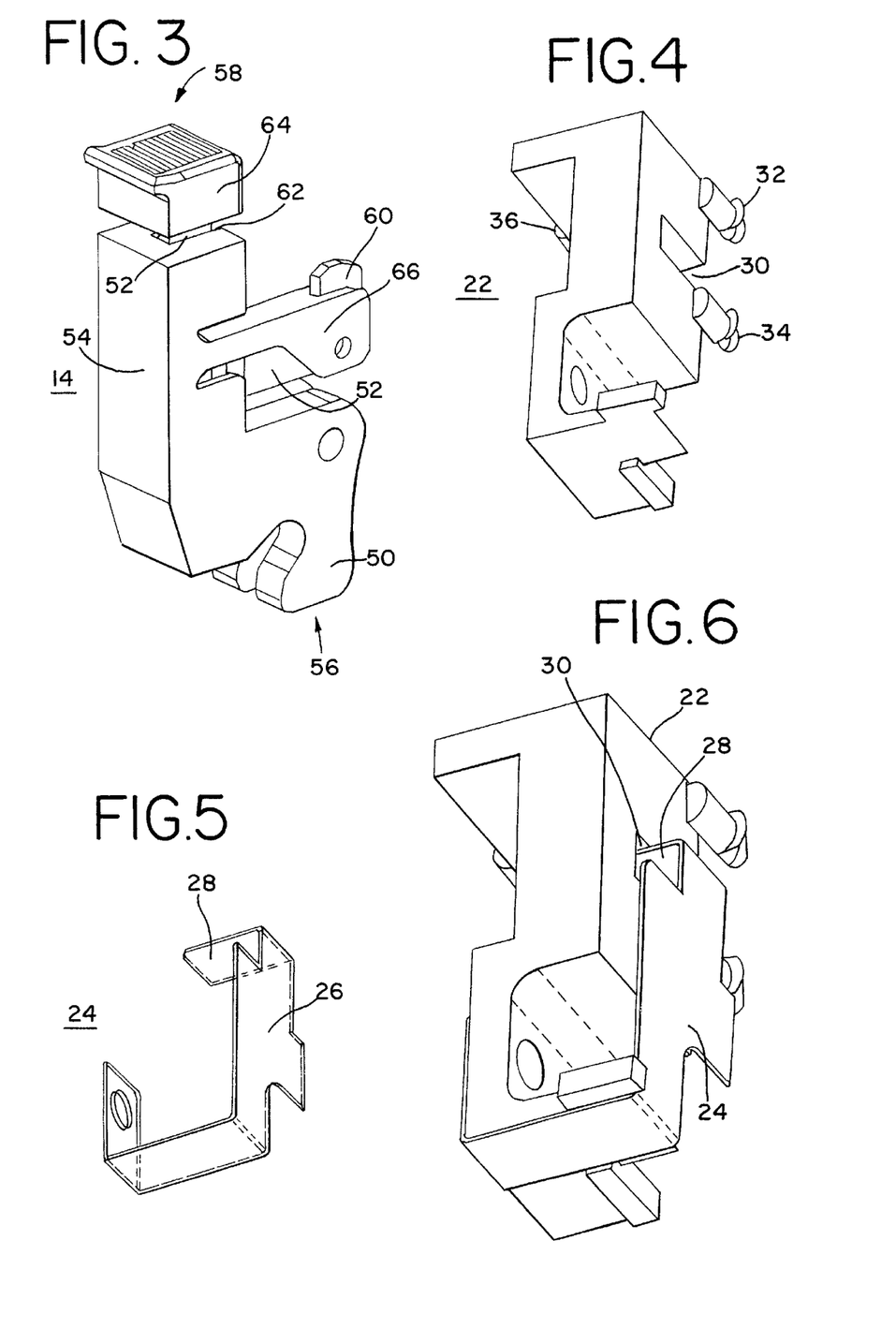
FIG. 3 is a perspective view of the circuit board ejector shown in FIGS. 1 and 2.
FIG. 4 is a perspective view of the housing member shown in FIGS. 1 and 2.
FIG. 5 is a perspective view of the switch activation member shown in FIGS. 1 and 2.
FIG. 6 is an assembled view of the housing member shown in FIG. 4 and the switch activation member shown in FIG. 5.
Figure 7:
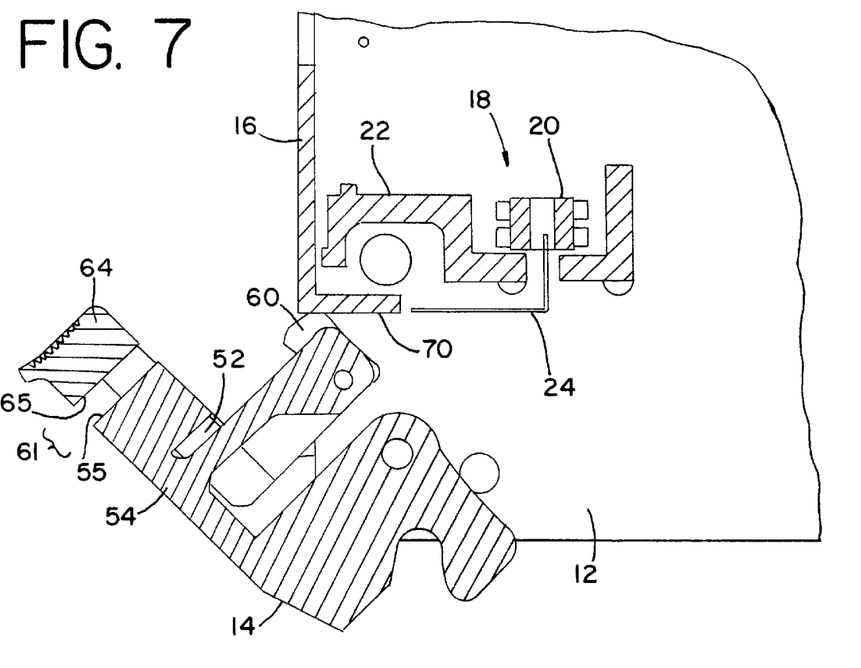
FIG. 7 is a sectional view of the apparatus for activating a switch with a circuit board ejector shown in FIG. 1 with the circuit board ejector in the unlatched position.
Figure 8:
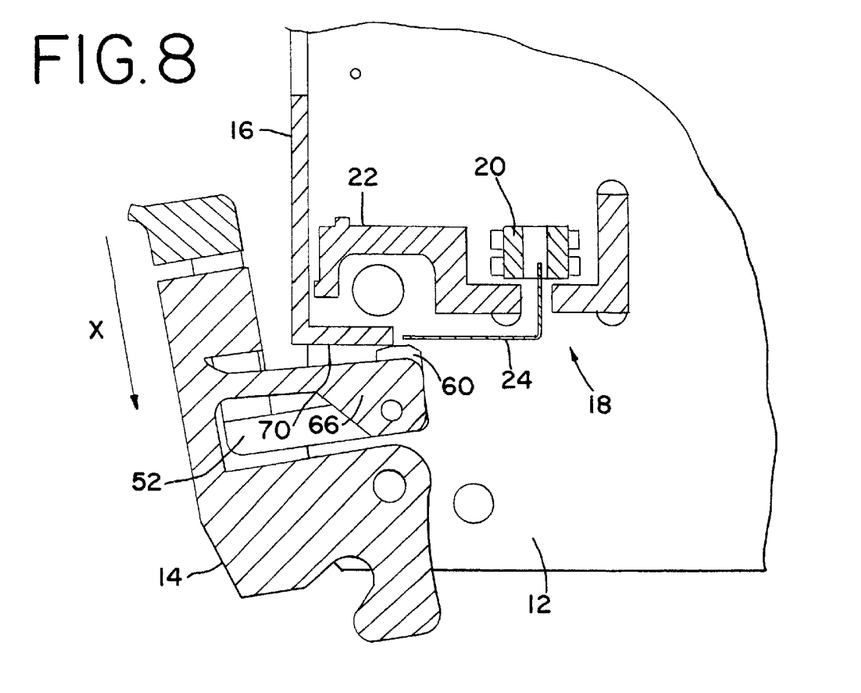
FIG. 8 is the embodiment of FIG. 7 showing the circuit board ejector rotated slightly towards the latched position.
Figure 9:
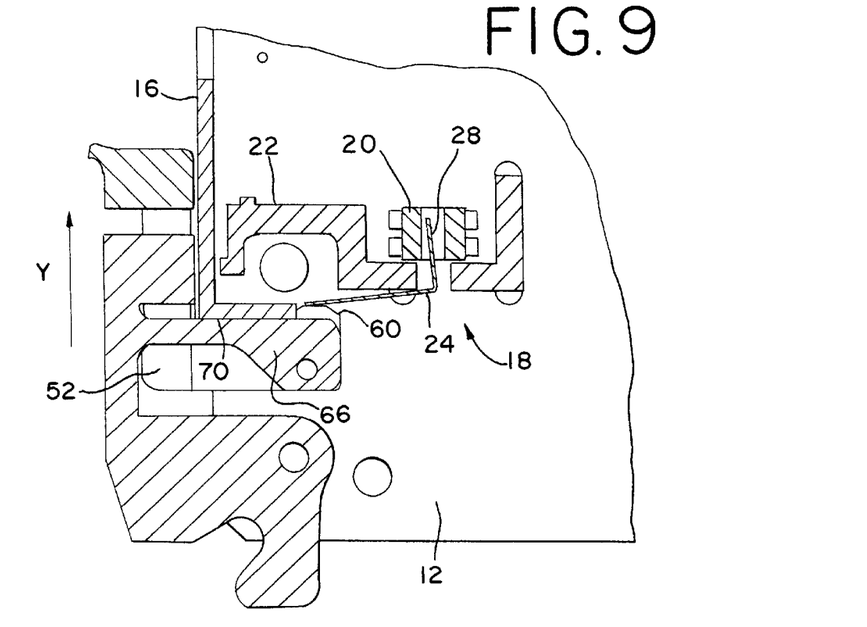
FIG. 9 is the embodiment of FIG. 7 showing the circuit board ejector in the latched position.

FIGS. 7–10 illustrate a preferred embodiment of the switch assembly 18 that is attached to the circuit board 12. In addition to the switch 20, the switch assembly 18 may preferably include a housing member 22 mounted to the circuit board 12 adjacent to the switch 20. FIGS. 4 and 6 are enlarged views of the housing member 22. In the embodiment shown in FIGS. 7–10, for example, when a light beam is transmitted and received between a first side of the switch 20 and a second side of the switch 20 (as shown in FIG. 7), the switch 20 causes the circuit board 12 to be in, for example, a first mode. When the light beam is blocked from being transmitted and received between the first and second sides of the switch 20 (as shown in FIG. 9), then the switch 20 causes the circuit board 12 to transition from the first mode to a second mode.

Referring to FIG. 6 (and also FIGS. 7–10), a switch activation member 24 may preferably be operatively attached to the housing member 22. The switch activation member 24 is shown in FIG. 5. The switch activation member 24 may preferably be attached to the housing member 22 with any conventional fastener. As shown in FIGS. 7–10, the switch activation member 24 may preferably be configured to have an open position (see FIGS. 7, 8, and 10) and a closed position (see FIG. 9). When the switch activation member 24 is in the open position, the switch 20 causes the circuit board 12 to be in, for example, a first mode. When the switch activation member 24 is in the closed position, the light beam is blocked, and the switch 20 causes the circuit board 12 to be in, for example, a second mode. The switch activation member 24 may preferably be biased in the open position, and may preferably be comprised of spring steel. As shown in FIG. 5, the switch activation member 24 includes a planar body portion 26 and a tab portion 28 extending outward perpendicular from the planar body portion 26.

As shown in FIGS. 4 and 6, the housing member 22 may preferably include a guide slot 30 formed therein. The tab portion 28 of the switch activation member 24 may preferably extend through the guide slot 30 of the housing member 22. As shown in FIG. 4, housing member 22 may preferably include a plurality of circuit board locks 32, 34, 36 to allow the housing member 22 to be fastened to the circuit board 12. In the embodiment shown in FIG. 1, for example, the plurality of circuit board locks 32, 34, 36 extend through openings in the circuit board 12 such as those shown, for example, at 38, 40, and 42. The housing member 22 may preferably be comprised of a rigid, insulative material.

Referring to FIG. 3, the circuit board ejector 14 includes a hook portion 50 and a bracket arm 52. When the circuit board ejector 14 is rotated from the unlatched position to the latched position, the hook portion 50 engages the electronic chassis (not chassis) to secure the circuit board 12 and the bracket member 16 to the electronic chassis (not shown). Similarly, when the circuit board ejector 14 is rotated from the latched position to the unlatched position, the hook portion 50 ejects the circuit board 12 and the bracket member 16 from the electronic chassis (not shown).

Referring again to FIGS. 1 and 2, the circuit board 12 includes a corner portion 13, and the circuit board ejector 14 is rotatably attached to the corner portion 13 of the circuit board 12. It will be appreciated by those of ordinary skill in the art, however, that the circuit board ejector 14 may be secured to another portion of the circuit board 12, depending upon the particular application.

Referring again to FIG. 3, the circuit board ejector 14 includes a body portion 54, a first end 56 and a second end 58. The hook portion 50 may preferably be located at the first end 56 of the circuit board ejector 14. In the embodiment shown, for example, the hook portion 50 is formed integral with the circuit board ejector 14, which may preferably be comprised of an insulative material. As shown in FIGS. 7–10, the bracket arm 52 may preferably be an L-shaped bracket arm, although other shapes and configurations are contemplated. As shown in FIGS. 3 and 9, the bracket arm 52 may preferably include a contact portion 60 for contacting the switch assembly 18, and in particular, the switch activation member 24. The bracket arm 52 may preferably be comprised of any rigid material such as, for example, metal or steel.

Referring to FIG. 3, the circuit board ejector 14 may preferably include a slot 62 formed therein extending along the body portion 54, and the bracket arm 52 may preferably be disposed with the slot 62 of the circuit board ejector 14. A manually operable cap 64 may preferably be positioned at the second end 58 of the circuit board ejector 14. In the embodiment shown, for example, the manually operable cap 64 is attached to the bracket arm 52. As shown in FIG. 7, for example, the manually operable cap 64 has a contact surface 65, and the body portion 54 of the circuit board ejector 14 has a contact surface 55 spaced apart from the contact surface 59. A gap 61 is formed between the contact surfaces 55 and 65. This arrangement limits the amount of distance the bracket arm 52 can be moved thereby protecting the bracket arm 52 from being overstressed and deformed.

Referring again to FIG. 3, the circuit board ejector 14 may also preferably include a deflectable arm portion 66. The deflectable arm portion 66 may preferably extend outward from the body portion 54 of the circuit board ejector 14. In the embodiment shown, the deflectable arm portion 66 is formed integral with the circuit board ejector 14. The bracket arm 52 is attached to the deflectable arm portion 66. The bracket arm 52 may be attached to the deflectable arm portion 66 in any conventional manner. In operation, when the manually operable cap 64 is depressed, the bracket arm 52 moves downward along the body portion 54 of the circuit board ejector 14. Because the bracket arm 52 is attached to the deflectable arm portion 66, the deflectable arm portion 66 is deflected when the bracket arm 52 is moved in this downward direction.

FIG. 7 shows the circuit board ejector 14 in the unlatched position. In this position, the bracket arm 52, and in particular, the contact portion 60 of the bracket arm 52 is in contact with a striking surface 70 of the bracket member 16. In this position, the switch activation member 24 of the switch assembly 18 is biased in the open position. As a result, the switch 20 causes the circuit board 12 to be in, for example, a first mode. FIG. 8 shows the circuit board ejector 14 rotated slightly from the unlatched position in a direction towards the latched position. As shown in FIG. 8, the contacting of the bracket arm 52 (in particular the contact portion 60 of the bracket arm 52) against the striking surface 70 of the bracket member 16 and the rotation of the circuit board ejector 14 causes the bracket arm 52 to move in the X direction. The deflectable arm portion 66 is therefore deflected as a result of the movement of the bracket arm 52 in the X direction.

As shown in FIG. 9, when the circuit board ejector 14 is rotated even further and the contact portion 60 of the bracket arm 52 travels beyond the striking surface 70 of the bracket member 16, the contact portion 60 of the bracket arm 52 contacts against the switch activation member 24 of the switch assembly 18. Once the contact portion 60 travels beyond the striking surface 70 of the bracket member 16, the deflectable arm portion 66 returns to its undeflected state, which causes the contact portion 60 to move the switch activation member 24 in the Y direction to the closed position. Once in the closed position, the switch activation member 24, and in particular, the tab portion 28 of the switch activation member 24, block the beam of light generated by the switch 20, which in turn causes the circuit board 12 to transition from the first mode to a second mode. One advantage of this arrangement is that the switch 20 is activated by the circuit board ejector 14, which reduces the number of parts required for activation of the switch 20. Moreover, the circuit board ejector 14 securely fastens the circuit board 12 to the chassis (not shown) and protects the circuit board 12 from stresses caused by, for example, vibration and earthquakes. Finally, this arrangement ensures that the circuit board ejector 14 secures the circuit board 12 and the bracket member 16 to the electronic chassis (not shown) before the contact portion 60 of the bracket arm 52 contacts the switch activation member 24 and causes the circuit board 12 to transition from the first mode to the second mode. In other words, the circuit board 12 is mechanically secured to the electronic chassis (not shown) before the circuit board 12 is transitioned from the first mode to the second mode. This in turn prevents the problems associated with adding a circuit board to a chassis while power is being delivered to the chassis, including the interruption and/or loss of information being transferred between the various circuit boards within the chassis.

Figure 10:
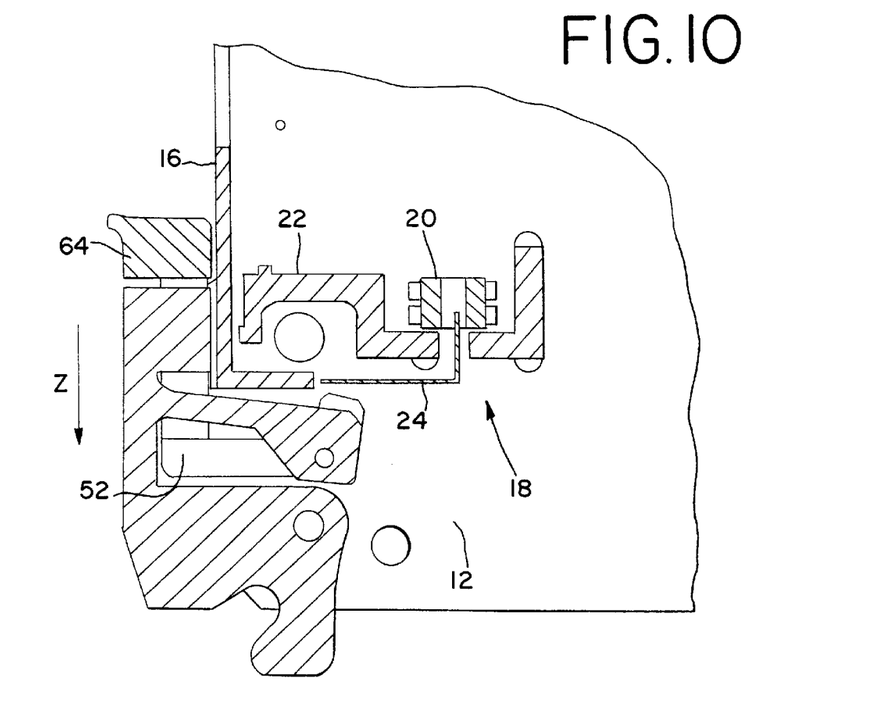
FIG. 10 is the embodiment of FIG. 7 showing the circuit board ejector in the latched position with the manually operable cap depressed.

FIG. 9 shows the circuit board ejector 14 in the fully latched position. In order to remove the circuit board 12 from the chassis (not shown), a technician may first, for example, press the manually operable cap 64 in a downward direction as shown in FIG. 10. As shown in FIG. 10, this causes the bracket arm 52 to move in the Z direction, which in turn causes the switch activation member 24 to move from the closed position to the open position. As a result, the light beam is not blocked from being transmitted and received between the first second sides of the switch 20, and the switch 20 causes the circuit board 12 to transition from one mode to another mode. As shown in FIGS. 7, and 8, the circuit board ejector 14 can then be rotated from the latched position to the unlatched position to allow the circuit board 12 and the and bracket member 16 to be removed from the electronic chassis (not shown). The advantage of this arrangement is that the circuit board 12 is transitioned from one mode to another mode before the circuit board 12 and the bracket member 16 are removed from the electronic chassis (not shown). Again, this prevents the problems associated with removing a circuit board from a chassis while power is being delivered to the chassis, including the interruption and/or loss of information being transferred between the various circuit boards within the chassis.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An apparatus for activating a switch with a circuit board ejector comprising:
   a circuit board, a switch assembly including the switch for transitioning the circuit board from a first mode to a second mode and vice versa, the switch assembly attached to the circuit board, the switch assembly further including a housing member mounted to the circuit board adjacent to the switch, a switch activation member operatively attached to the housing member to allow the switch activation member to be positioned in an open position and a closed position, the circuit board ejector rotatably attached to the circuit board to allow the circuit board ejector to be positioned in an unlatched position and a latched position, the circuit board ejector including a hook portion and a bracket arm wherein the circuit board ejector activates the switch assembly and causes the circuit board to transition from the first mode to the second mode and vice versa.

2. The apparatus of claim 1 wherein the bracket arm of the circuit board ejector activates the switch assembly and causes the circuit board to transition from the first mode to the second mode and vice versa.

3. The apparatus of claim 1 further comprising a bracket member, the circuit board operatively attached to the bracket member.

4. The apparatus of claim 3 wherein the bracket member is a U-shaped channel member.

5. The apparatus of claim 1 wherein the switch activation member is biased in the open position.

6. The apparatus of claim 5 wherein the switch activation member is comprised of spring steel.

7. The apparatus of claim 5 wherein the switch activation member includes a planar body portion and a tab portion extending outward perpendicular from the planar body portion.

8. The apparatus of claim 5 wherein housing member includes a slot formed therein, the tab portion extending through the slot of the housing member.

9. The apparatus of claim 8 wherein the housing member includes a plurality of circuit board locks, the plurality of circuit board locks extending through openings in the circuit board.

10. The apparatus of claim 1 wherein the housing member is comprised of a rigid, insulative material.

11. The apparatus of claim 1 wherein the switch is an optoelectronic switch.

12. The apparatus of claim 1 wherein the circuit board includes a corner portion, the circuit board ejector rotatably attached to the corner portion of the circuit board.

13. The apparatus of claim 1 wherein the circuit board ejector includes a body portion, a first end and a second end, the hook portion located at the first end.

14. The apparatus of claim 13 further comprising a manually operable cap, the manually operable cap at the second end of the circuit board ejector.

15. The apparatus of claim 14 wherein the manually operable cap is attached to the bracket arm.

16. The apparatus of claim 13 wherein the circuit board ejector includes a slot formed therein, the bracket arm disposed within the slot of the circuit board ejector.

17. The apparatus of claim 13 wherein the circuit board ejector includes a deflectable arm portion, the deflectable arm portion extending outward from the body portion.

18. The apparatus of claim 17 wherein the bracket arm is attached to the deflectable arm portion.

19. The apparatus of claim 1 wherein the bracket arm includes a contact portion for contacting the switch assembly.

20. The apparatus of claim 19 wherein the contact portion includes a beveled edge.

21. A method of activating a switch with a circuit board ejector comprising the steps of:
   providing a circuit board, a switch assembly including the switch for transitioning the circuit board from a first mode to a second mode and vice versa, the switch assembly attached to the circuit board, the switch assembly further including a housing member mounted to the circuit board adjacent to the switch, a switch activation member operatively attached to the housing member to allow the switch activation member to be positioned in an open position and a closed position, the circuit board ejector rotatably attached to the circuit board to allow the circuit board to be positioned in an unlatched position and a latched position, the circuit board ejector including a hook portion and a bracket arm;
   rotating the circuit board ejector from the unlatched position to the latched position;
   contacting the circuit board ejector against the switch assembly;

activating the switch; and transitioning the circuit board from the second mode to the first mode.

22. The method of claim 21 further comprising the steps of:

contacting the bracket arm against the switch assembly.

23. The method of claim 22 wherein the circuit board ejector includes a body portion and a deflectable arm portion extending outward from the body portion, the bracket arm attached to the deflectable arm portion and further comprising the steps of:

providing a bracket member including a striking surface, the circuit board attached to the bracket member;

contacting the bracket arm against the striking surface; and biasing the deflectable arm portion.

24. A method of activating a switch with a circuit board ejector comprising the steps of:

providing a circuit board, a switch assembly including the switch for transitioning the circuit board from a first mode to a second mode and vice versa, the switch assembly attached to the circuit board, the circuit board ejector rotatably attached to the circuit board to allow the circuit board ejector to be positioned in an unlatched position and a latched position, the circuit board ejector positioned in the latched position, the circuit board ejector including a hook portion and a bracket arm, the bracket arm in contact with the switch assembly, providing a manually operable cap, the manually operable cap attached to the bracket arm;

depressing the manually operable cap;

moving the bracket arm in a direction away from the switch assembly;

activating the switch; and transitioning the circuit board from the first mode to the second mode.

* * * * *